United States Patent
Yu et al.

(10) Patent No.: US 10,276,664 B2
(45) Date of Patent: Apr. 30, 2019

(54) SEMICONDUCTOR STRUCTURES AND METHODS FOR MULTI-DIMENSION OF NANOWIRE DIAMETER TO IMPROVE DRIVE CURRENT

(71) Applicant: Taiwan Semiconductor Manufacturing Company Limited, Hsinchu (TW)

(72) Inventors: Tsung-Hsing Yu, Taipei (TW); Chia-Wen Liu, Taipei (TW); Yeh Hsu, Taoyuan County (TW); Jean-Pierre Colinge, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/176,389

(22) Filed: Feb. 10, 2014

(65) Prior Publication Data
US 2015/0228775 A1    Aug. 13, 2015

(51) Int. Cl.
*B82Y 10/00*    (2011.01)
*B82Y 40/00*    (2011.01)
(Continued)

(52) U.S. Cl.
CPC .......... *H01L 29/1037* (2013.01); *B82Y 10/00* (2013.01); *B82Y 40/00* (2013.01);
(Continued)

(58) Field of Classification Search
CPC ............. H01L 29/0673; H01L 29/0665; H01L 29/775; H01L 29/78696; H01L 29/66439;
(Continued)

(56) References Cited

U.S. PATENT DOCUMENTS

2004/0262681 A1* 12/2004 Masuoka .......... H01L 29/42384
                                                          257/335
2005/0269629 A1* 12/2005 Lee ...................... H01L 21/845
                                                          257/327
(Continued)

FOREIGN PATENT DOCUMENTS

WO    2013137605    9/2013

OTHER PUBLICATIONS

Larrieu, G., Han, X.-L.; Vertical Nanowire Array-Based Field Effect Transistors for Ultimate Scaling; Nanoscale, 5; pp. 2437-2441; 2013.
(Continued)

*Primary Examiner* — Nduka E Ojeh
(74) *Attorney, Agent, or Firm* — Jones Day (57) ABSTRACT

A semiconductor device having a channel formed from a nanowire with a multi-dimensional diameter is provided. The semiconductor device comprises a drain region formed on a semiconductor substrate. The semiconductor device further comprises a nanowire structure formed between a source region and the drain region. The nanowire structure has a first diameter section joined with a second diameter section. The first diameter section is coupled to the drain region and has a diameter greater than the diameter of the second diameter section. The second diameter section is coupled to the source region. The semiconductor device further comprises a gate region formed around the junction at which the first diameter section and the second diameter section are joined.

22 Claims, 8 Drawing Sheets

(51) Int. Cl.

| | |
|---|---|
| *H01L 29/06* | (2006.01) |
| *H01L 29/08* | (2006.01) |
| *H01L 29/10* | (2006.01) |
| *H01L 29/66* | (2006.01) |
| *H01L 29/423* | (2006.01) |
| *H01L 29/775* | (2006.01) |
| *H01L 21/20* | (2006.01) |
| *H01L 21/36* | (2006.01) |

(52) U.S. Cl.
CPC ...... *H01L 29/0676* (2013.01); *H01L 29/0873* (2013.01); *H01L 29/42376* (2013.01); *H01L 29/66439* (2013.01); *H01L 29/66666* (2013.01); *H01L 29/775* (2013.01)

(58) Field of Classification Search
CPC ........... H01L 29/0676; H01L 29/42392; H01L 29/785; H01L 29/068; H01L 33/24; H01L 21/02628; H01L 29/66795; H01L 29/78642
USPC ......... 257/24, E29.262, E29.245, E21.19, 9, 257/E21.409, 329, E21.114, E29.081, 257/E29.168, E29.255, E33.004, 192, 257/288; 438/151, 197, 595, 157, 209, 438/257, 299, 585, 201, 212, 268, 478
See application file for complete search history.

(56) References Cited

U.S. PATENT DOCUMENTS

| | | | |
|---|---|---|---|
| 2008/0068876 A1* | 3/2008 | Sandhu | B82Y 10/00 365/149 |
| 2008/0186772 A1* | 8/2008 | Horch | H01L 21/28273 365/185.18 |
| 2008/0251825 A1* | 10/2008 | Lee | G11C 11/403 257/297 |
| 2009/0200605 A1* | 8/2009 | Bjoerk | B82Y 10/00 257/330 |
| 2009/0201743 A1* | 8/2009 | Yang | 365/185.28 |
| 2009/0294757 A1* | 12/2009 | Wernersson et al. | 257/14 |
| 2010/0078698 A1* | 4/2010 | Son et al. | 257/296 |
| 2010/0301402 A1* | 12/2010 | Masuoka | H01L 21/26586 257/288 |
| 2013/0207079 A1* | 8/2013 | Sleight | H01L 29/775 257/24 |
| 2015/0069330 A1* | 3/2015 | Baek | H01L 29/775 257/29 |

OTHER PUBLICATIONS

Nehari, K., Cavassilas, N., Autran, J.L., Bescond, M., Munteanu, D., Lannoo, M.; Influence of Band Structure on Electron Ballistic Transport in Silicon Nanowire MOSFET's: An Atomistic Study; Solid-State Electronics, 50; pp. 716-721; 2006.

Taiwan Office Action; Application No. 103146204; dated Sep. 7, 2016.

* cited by examiner

SEMICONDUCTOR STRUCTURES AND METHODS FOR MULTI-DIMENSION OF NANOWIRE DIAMETER TO IMPROVE DRIVE CURRENT

BACKGROUND

The technology described in this patent document relates generally to semiconductor devices and more particularly to nanowire semiconductor devices.

Scaling of semiconductor devices, such as a metal-oxide semiconductor field-effect transistor (MOSFET), has enabled continued improvement in speed, performance, density, and cost per unit function of integrated circuits over the past few decades. Development of nanowire devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
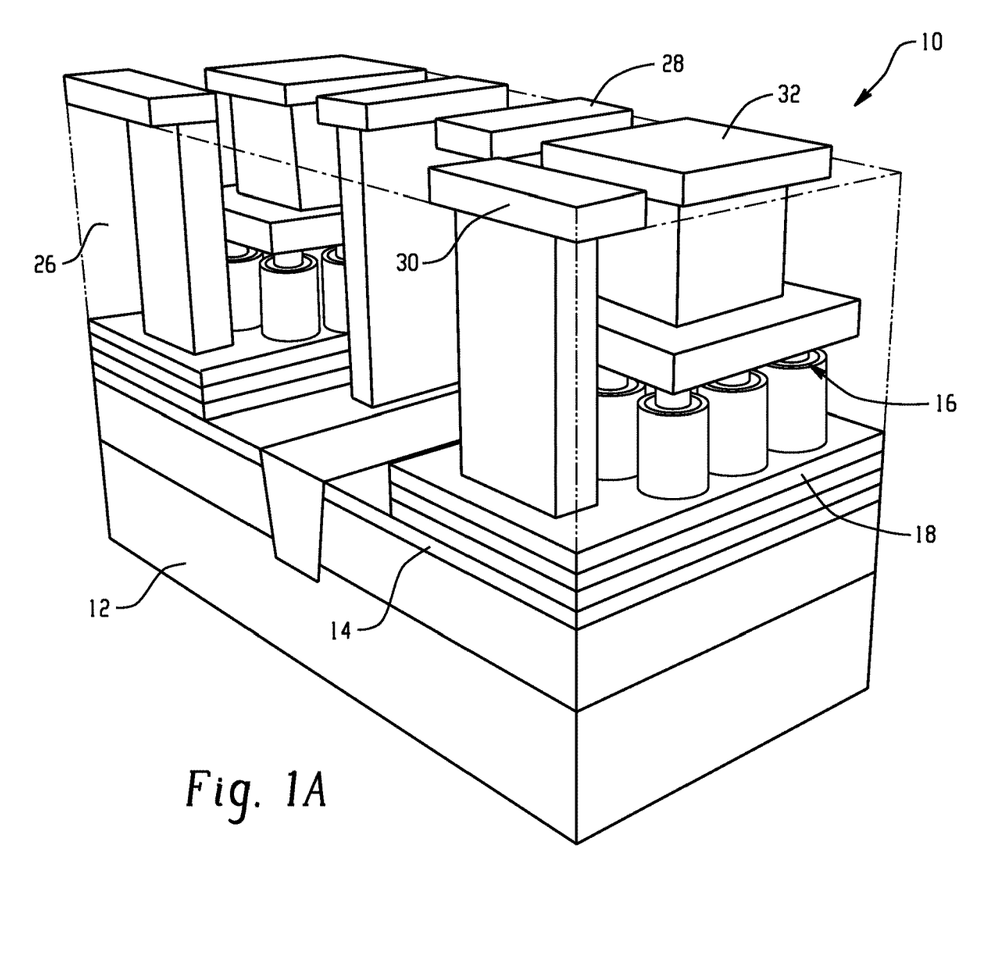
FIG. 1A is a diagram of an example semiconductor device that is formed using nanowire technology, in accordance with some embodiments.

FIG. 1A is a diagram of an example semiconductor device 10 that is formed using nanowire technology. The device is fabricated on a substrate 12. In this example, the substrate comprises bulk substrate, although other substrate structures such as silicon-on-insulator (SOI) may be used. In some embodiments the bulk substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate 12 may include isolation regions, doped regions, and/or other features.

The example semiconductor device 10 further includes a source region 14 in the substrate 12, one or more nanowire structures 16, and gate material 18 above the substrate and surrounding a middle portion of the nanowire structures 16. The nanowire structures 16 in this example are oriented in a vertical direction and extend upwardly from the source region 14. In other examples, the nanowire structures may extend in other directions such as a horizontal direction. Also, although nanowires with a circular cross-sectional shape are shown in this example, in other examples the cross-sectional shape may include circular, square, rectangular, triangular, trapezoidal, or other shapes.

Figure 1B:
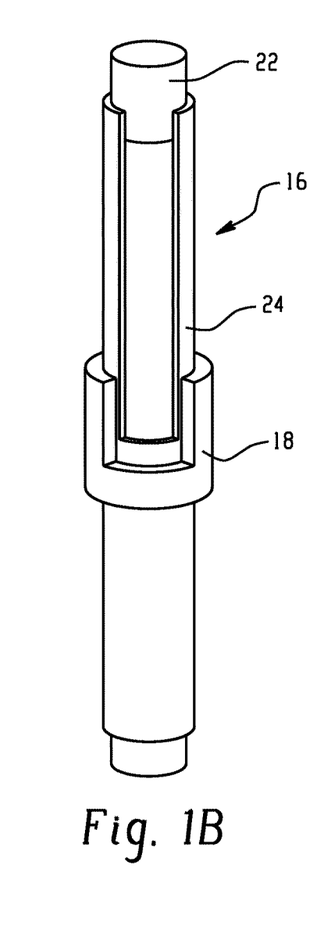
FIG. 1B depicts an example nanowire structure that may be used in the semiconductor device of FIG. 1A, in accordance with some embodiments.

FIG. 1B is a diagram illustrating an example nanowire structure 16 used in the device 10. The example nanowire structure 16 comprises semiconductor material such as silicon that is used to form a channel region between the source region 14 and a drain region 22. The drain region 22 in this example is at the far end section of the nanowire structure 16 opposite the source region 14 and comprises platinum silicide. Gate oxide 24 is also shown surrounding the nanowire structure 16.

Referring back to FIG. 1A, the example semiconductor device 10 further includes insulation material 26 above the substrate 12 and surrounding the nanowire structures 16 and gate material 18. Metal contacts are also included in the semiconductor device 10. In this example, shown are a source contact 28, a gate contact 30 and a drain contact 32.

The number of nanowires needed in a design may be a function of the drive current required for the semiconductor device. By increasing the drive current per nanowire, the number of nanowires required to produce the desired drive current may be reduced.

It has been determined that drive current (I) is equal to total channel charge (nq) multiplied by the average carrier velocity (v) and can be expressed by the following formula: I=nqv. To increase the drive current in the example nanowire devices, band structure engineering can be applied to increase the average carrier velocity through the modulation of the channel electric field.

Figure 2A:
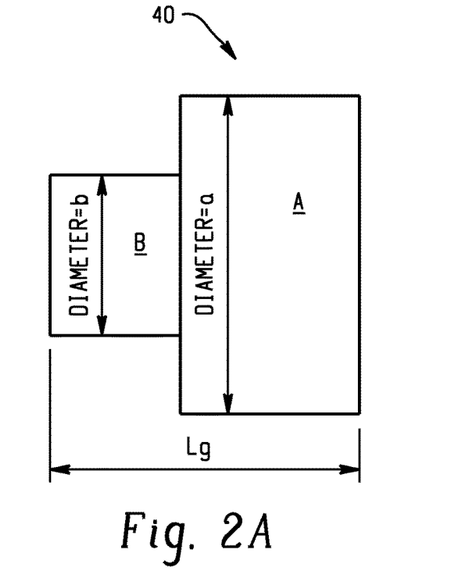
FIG. 2A depicts another example nanowire structure, in accordance with some embodiments.

FIG. 2A depicts an example nanowire structure 40 that can be implemented in a semiconductor device. The nanowire structure 40 has a total length Lg and includes a first nanowire section A with a diameter a. The nanowire structure 40 further includes a second nanowire section B with a diameter b.

Figure 2B:
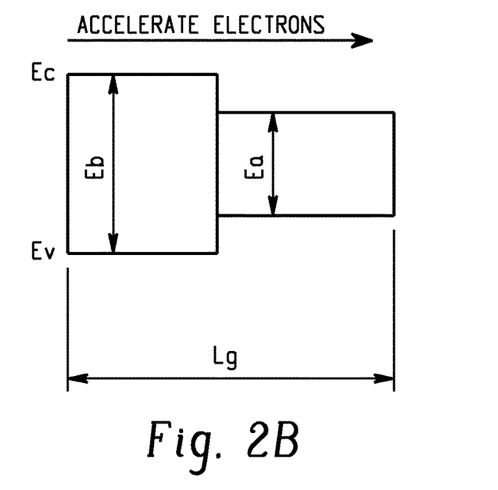
FIG. 2B illustrates the relative levels of the conduction band Ec and valence band Ev for the two nanowire sections A and B of FIG. 2A, in accordance with some embodiments.

FIG. 2B depicts a drawing illustrating the relative levels of the conduction band $E_c$ and valence band $E_v$ for the two nanowire sections A and B. As the figure illustrates, the conduction band $E_c$ level of the first nanowire section A is lower than the conduction band $E_c$ level of the second nanowire section B. Also, as illustrated in the figure, the valence band $E_v$ level of the first nanowire section A is lower than the valence band $E_v$ level of the second nanowire section B. The diameter change from second nanowire section B to first nanowire section A with diameter a greater than diameter b results in band gap energy $E_b$ corresponding to section B and band gap energy $E_a$ corresponding to section A wherein band gap energy $E_b$ is greater than band gap energy $E_a$. The differences in band gap energy can cause the flow of electrons from the second nanowire section B to the first nanowire section A to accelerate. The carrier velocity will be enhanced by the band gap induced electric field at the two diameter interface.

Figure 3:
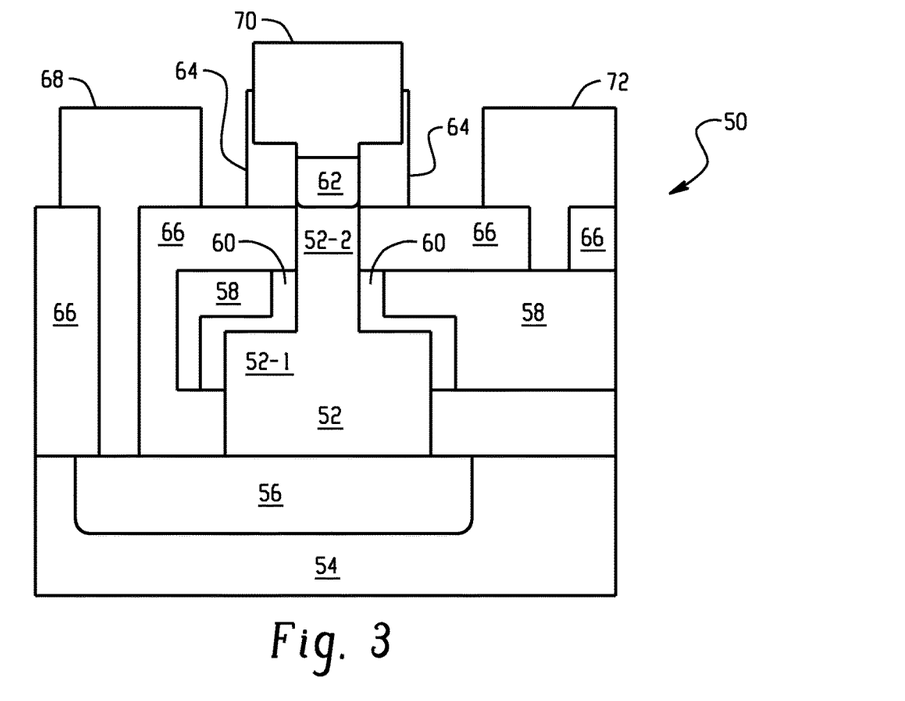
FIG. 3 is a cross sectional view of an example MOSFET semiconductor device that includes a nanowire with a multi-dimensional diameter for the channel material, in accordance with some embodiments.

Depicted in FIG. 3 is a cross sectional view of an example MOSFET semiconductor device 50 that includes a nanowire 52 with a multi-dimensional diameter for the channel material. The example MOSFET semiconductor device 50 may be fabricated using suitable processes including photolithography, etching, cleaning, chemical mechanical polishing/planarization (CMP), thin film deposition, thermal process (e.g., doping, activation/surface, passivation/material consolidation), epitaxy, and material filling, among others. For example, the photolithography process may include forming a photoresist layer (resist), exposing the resist to a pattern, performing post-exposure bake processes, and developing the resist to form a masking element. The masking element may then be used in an etching process. The etching may be performed using reactive ion etch (RIE) and/or other suitable processes.

The example MOSFET semiconductor device 50 includes a silicon substrate 54 with a doped region 56 which functions as a drain region. The nanowire 52 is formed above the drain region 56 with a wider diameter portion 52-1 adjacent to the drain region 56 a smaller diameter portion 52-2 on the opposite end of the nanowire 52. Although the nanowire 52 shown in this example has two different diameter portions, in other examples the nanowire 52 may have three or more different diameter portions with the diameter tapering down from portion to portion in the source to drain direction.

The example MOSFET semiconductor device 50 further includes gate material 58 including a Hi-K dielectric 60 surrounding a section of the nanowire 52 at the junction between the wider diameter portion 52-1 and the smaller diameter portion 52-2. The example MOSFET semiconductor device 50 also includes a source region 62 that may comprise silicide at the end of the nanowire 52 opposite the drain region 56 and may have nitride 64 surrounding the source region 62. The MOSFET semiconductor device 50 also includes insulator material 66 and metal contacts. The metal contacts include a drain contact 68, a gate contact 72, and a source contact 70.

Figure 4:
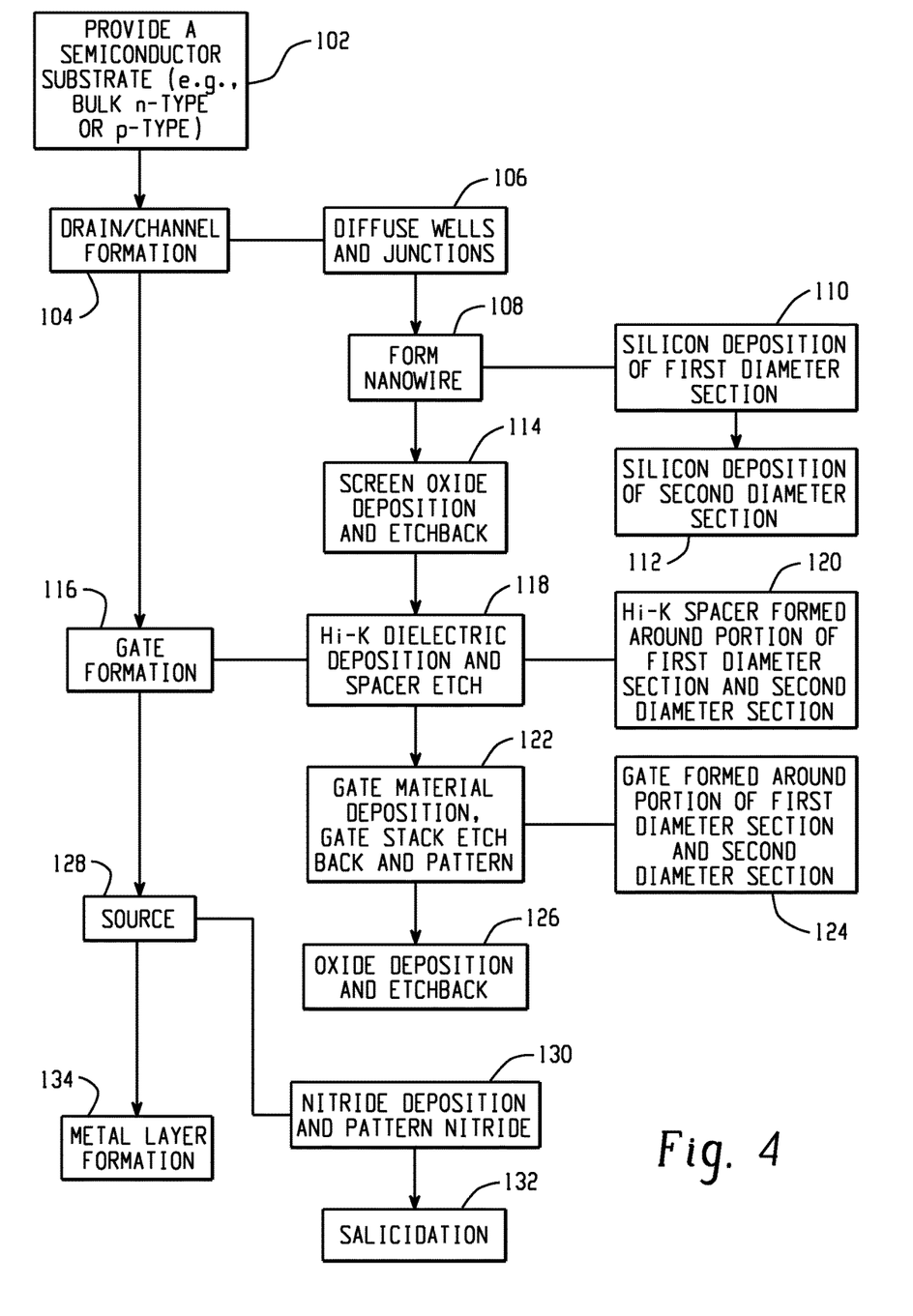
FIG. 4 is a process flow chart depicting an example method for generating a semiconductor device structure having a nanowire with a multi-dimensional diameter in the channel area, in accordance with some embodiments.

FIG. 4 is a process flow chart depicting an example method for generating a semiconductor device structure having a nanowire with a multi-dimensional diameter in the channel area. A semiconductor substrate is provided (operation 102). The substrate may be a bulk substrate such as a bulk n-type or bulk p-type substrate. Other substrates may also be used such as a semiconductor-on-insulator substrate.

Figure 5:
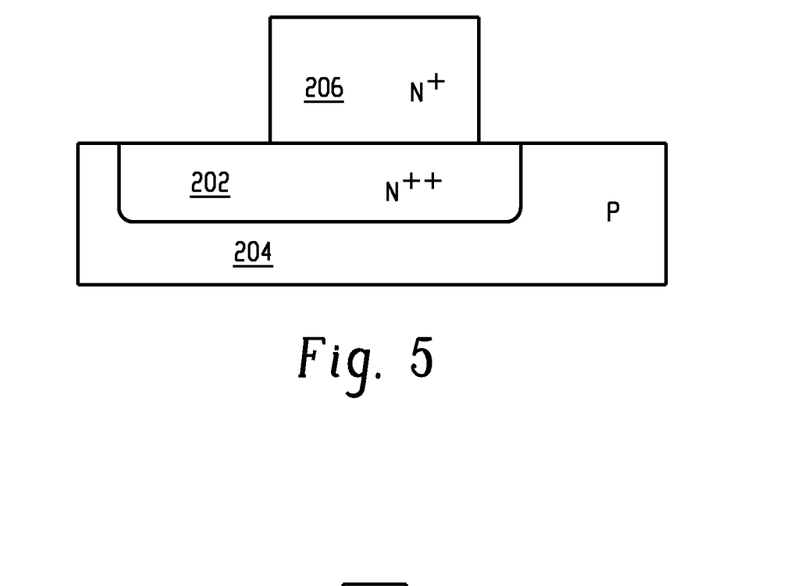
FIGS. 5-12 are drawings depicting example states of a semiconductor structure during fabrication of a semiconductor device structure having a nanowire with a multi-dimensional diameter in the channel area, in accordance with some embodiments.

The drain and channel regions of the semiconductor device are formed (operation 104). Drain formation may involve operations such as well and junction diffusion (operation 106) and N+ and P+ implantation to form a drain region in the semiconductor substrate. The channel region may be fabricated from one or more nanowires (operation 108). In this example, each nanowire has two diameter sections, a wider diameter section and a smaller diameter section. The first (wider) diameter section is formed first (operation 110), for example, through deposition operations. Alternatively, the narrow part of the nanowire may be etched to some depth. Spacers are then formed around the etched nanowire, and then further etching of the substrate is done to form the wider portion of the nanowire. FIG. 5 depicts a cross sectional view of a portion of a semiconductor device after drain 202 formation in the substrate 204 and formation of the first diameter section 206 of the nanowire. The first diameter section 206 may be formed from a semiconductor material such as silicon or other suitable semiconductor material.

Figure 6:
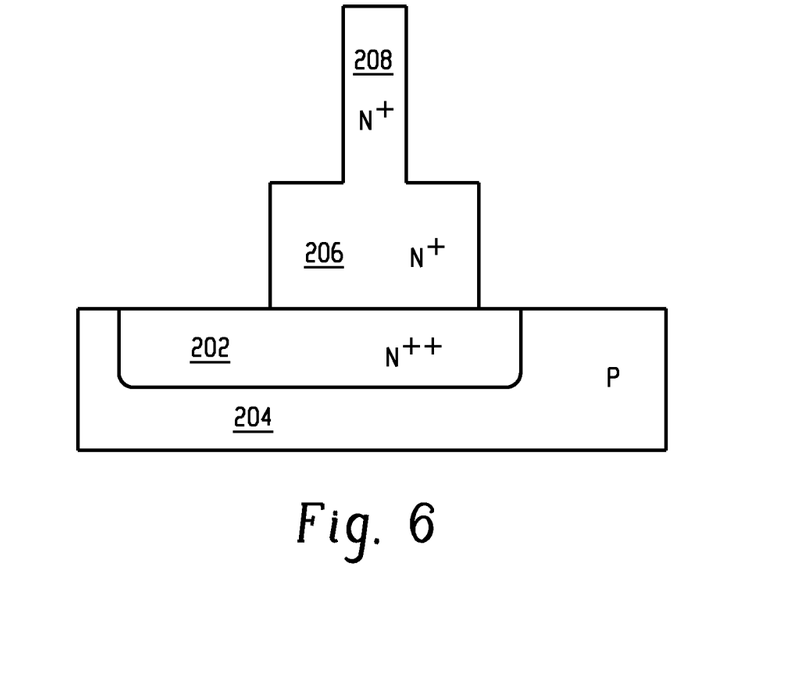

Referring back to FIG. 4, the second diameter section of the nanowire is formed (operation 112), for example, using epitaxial deposition operations. FIG. 6 depicts a cross sectional view of a portion of a semiconductor device after formation of the second diameter section 208 of the nanowire. The second diameter section 208 may be formed from a semiconductor material such as silicon or other suitable semiconductor material.

Figure 7:
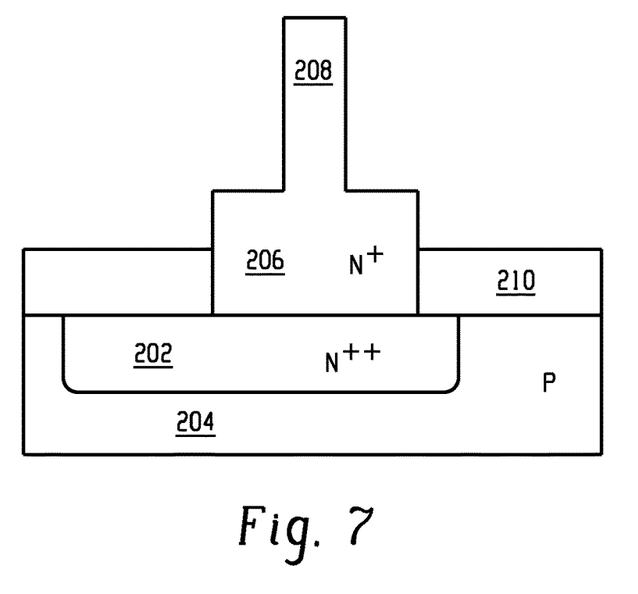

Referring back to FIG. 4, after the second diameter section of the nanowire is formed, screen oxide deposition and etch back takes place (operation 114). FIG. 7 depicts a cross sectional view of a portion of a semiconductor device after deposition and etch back of screen oxide 210.

Figure 8:
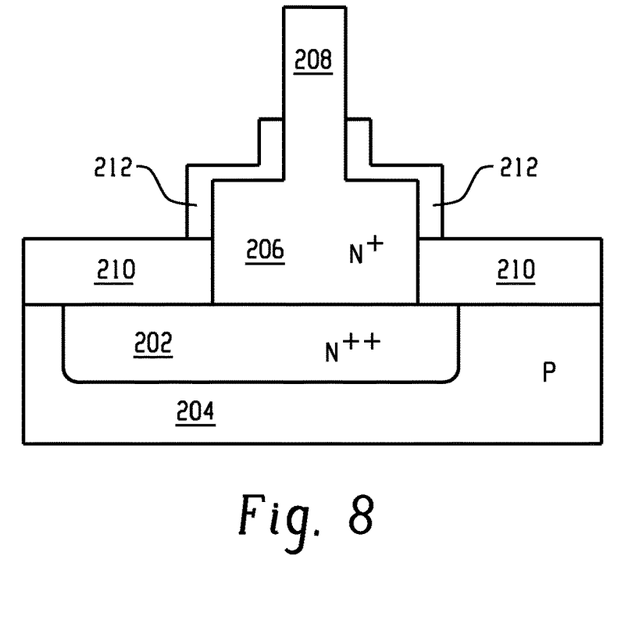

Referring back to FIG. 4, after drain and channel formation, gate formation (operation 116) may take place. Gate formation may involve High-K dielectric deposition and patterning (operation 118). This operation may result in a High-K spacer formed around the junction of the first diameter section and the second diameter section (operation 120). FIG. 8 depicts a cross sectional view of a portion of a semiconductor device after High-K spacer 212 formation around the junction of the first diameter section 206 and the second diameter section 208.

Figure 9:
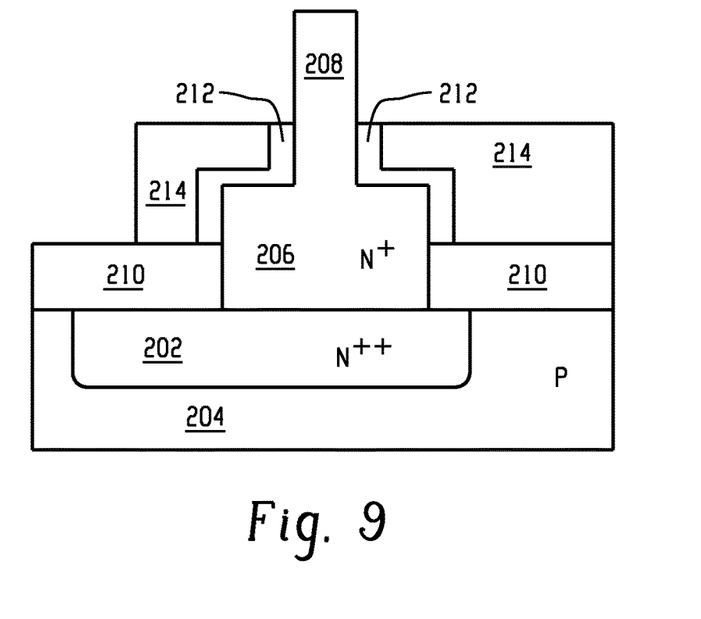

Referring back to FIG. 4, after High-K dielectric deposition and patterning, gate material deposition, gate stack etch back and gate stack patterning takes place (operation 122). This results in a transistor gate being formed around the junction of the first diameter section and the second diameter section (operation 124). FIG. 9 depicts a cross sectional view of a portion of a semiconductor device after formation of the gate 214.

Figure 10:
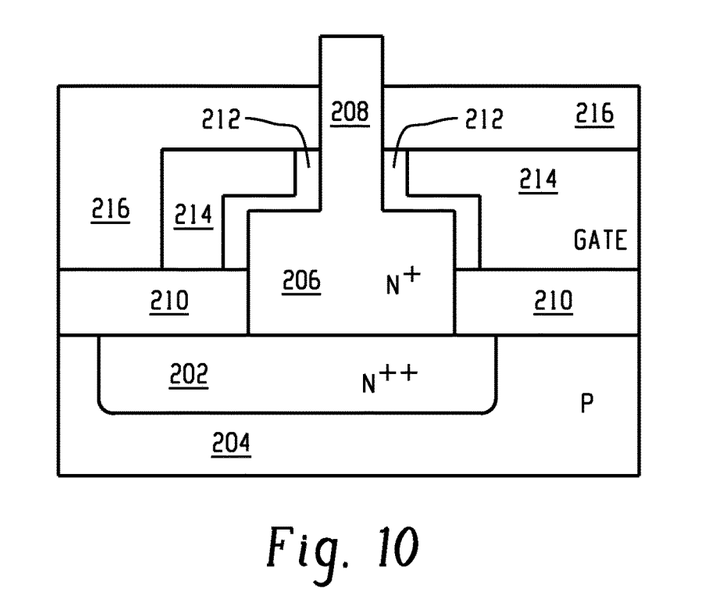

Referring back to FIG. 4, after gate stack patterning, oxide deposition and etch back operations takes place (operation 126). FIG. 10 depicts a cross sectional view of a portion of a semiconductor device after oxide deposition and etch back showing depositing oxide 216.

Figure 11:
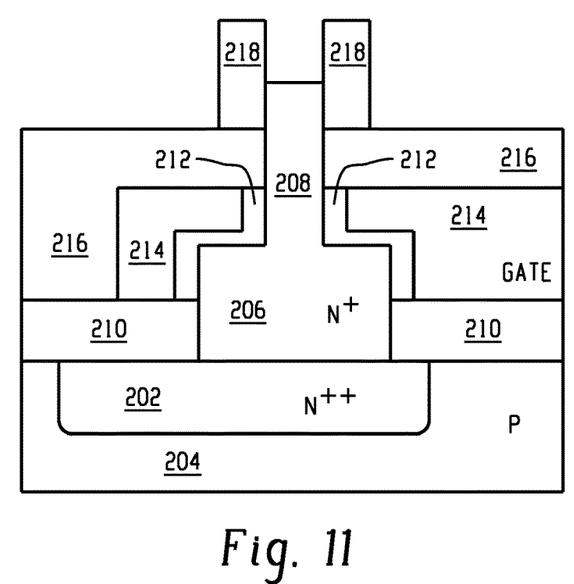

Referring back to FIG. 4, after gate formation and oxide deposition, drain formation may occur (operation 128). Drain formation may involve nitride spacer formation (operation 130). This may involve nitride deposition and patterning operations. FIG. 11 depicts a cross sectional view of a portion of a semiconductor device after nitride patterning and illustrates the deposited nitride spacer 218.

Figure 12:
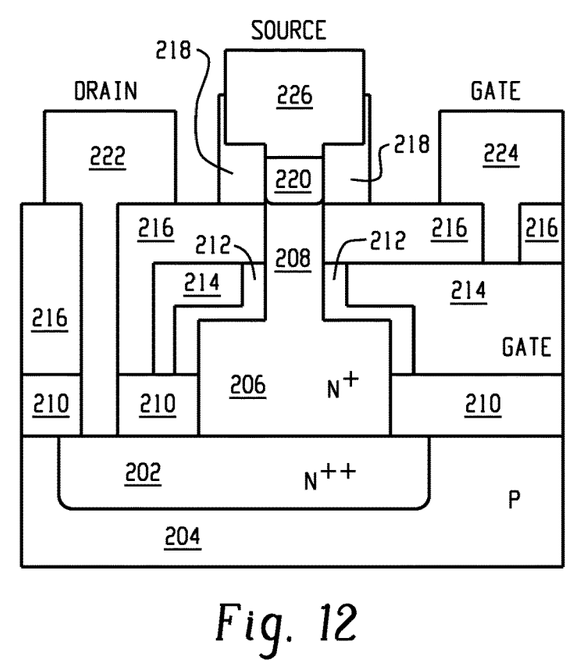

Referring back to FIG. 4, after nitride patterning, salicidation operations take place (operation 132) wherein silicide is formed at the end of the nanowire section opposite the substrate. Finally, metallization operations (operation 134) are shown where metal contacts are added to the source, drain, and gate regions of the transistor device. FIG. 12 depicts a cross sectional view of a portion of a semiconductor device after salicidation and metallization. The figure illustrates silicide 220 formed at the end of the second nanowire section 208 opposite the substrate 204 and metal contacts added to the source, drain, and gate regions of the transistor device. Shown are drain contact 222, gate contact 224, and source contact 226.

In the example transistor formed by the method of FIG. 4 and illustrated in FIG. 12, the diameter change from the first diameter section 206 to the second diameter section 208 should result in a band gap energy corresponding to the second diameter section 208 being greater than the band gap energy corresponding to the first diameter section 206. This difference in band gap energy should cause the flow of electrons from the first diameter section 206 to the second diameter section 208 to accelerate. The carrier velocity should be enhanced by the band gap induced electric field at the two diameter interface. Thus, the drive current for the semiconductor device should be increased without additional power consumption or supply voltage boost.

In the example transistor, the channel electric field is modulated by band structure engineering through the variation of the nanowire diameter. The diameter of the nanowire can increase gradually from drain to source. For the two-level diameter in the example transistor, the diameter ratio of the second diameter section 208 over the first diameter section 206 is less than or equal to one half. In other words, the diameter of the first diameter section 206 is at least twice that of the second diameter section 208. Additionally, the channel length for the first diameter section 206 is less than or equal to half of the total channel length.

Figure 13:
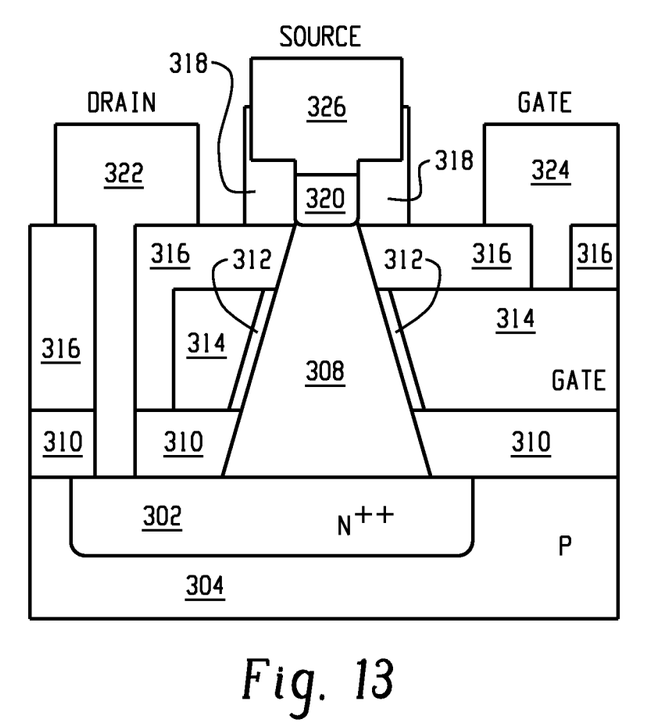
FIG. 13 depicts an example semiconductor device having a nanowire structure with a tapering diameter, in accordance with some embodiments.

Depicted in FIG. 13 is another example semiconductor device that may be formed using the teachings described herein. The device includes a drain region 302 formed in the substrate 304. The device further includes a nanowire channel region 308 that is formed with a tapered diameter. The tapered diameter continuously varies from a wider diameter section adjacent to the drain region 302 to a smaller diameter section at the end opposite the drain region 302. The nanowire channel region 308 may be formed from a semiconductor material such as silicon or other suitable semiconductor material. The device further includes screen oxide 310 that may be formed through deposition and etch back operations. Also shown are High-K spacers 312 around a portion of the nanowire channel region 308. The Hi-K spacers may be formed using dielectric deposition and patterning operations. The device also includes a transistor gate 314 around a portion of the nanowire channel region 308 and the Hi-K spacers. The transistor gate 314 may be formed using gate stack etch back and gate stack patterning operations. Also shown is deposited oxide 316, which may be formed by oxide deposition and etch back operations. Nitride deposition and patterning operations may be employed to form nitride spacers 318. Also, silicide 320 may be formed at the end of the nanowire section 308 opposite the substrate 304 using salicidation operations. Additionally, metal contacts may be provided to the source, drain, and gate regions of the transistor device. Shown are drain contact 322, gate contact 324, and source contact 326.

In the example transistor, the channel electric field is modulated by band structure engineering through the variation of the nanowire diameter. The diameter change from the drain to source should result in an increasing band gap energy in the drain to source direction. This difference in band gap energy should cause the flow of electrons to accelerate. The carrier velocity should be enhanced by the structure. Thus, the drive current for the semiconductor device should be increased without additional power consumption or supply voltage boost.

In accordance with the teachings described herein, semiconductor devices having a channel formed from a nanowire with a multi-dimensional diameter and methods for fabricating the semiconductor devices are provided. In one embodiment, the semiconductor device comprises a drain region formed on a semiconductor substrate. The semiconductor device further comprises a nanowire structure formed between the source region and a drain region. The nanowire structure has a first diameter section joined with a second diameter section. The first diameter section is coupled to the drain region and has a diameter greater than the diameter of the second diameter section. The second diameter section is coupled to the source region. The semiconductor device further comprises a gate region formed around the junction at which the first diameter section and the second diameter section are joined.

These aspects and other embodiments may include one or more of the following features. The gate region may comprise High-K dielectric material and metal gate material, wherein the High-K dielectric material is formed around the junction at which the first diameter section and the second diameter section are joined such that the circumference of the high-K material surrounding the second diameter section does not extend out as far as the circumference of the high-K material surrounding the first diameter section. The High-K dielectric surrounding the second diameter section may not extend out as far as the circumference of the first diameter section. The nanowire structure may further comprise a third diameter section having a diameter smaller than the diameter of the second diameter section and coupled between the second diameter section and the source region. The band gap energy of the first diameter section may be less than the band gap energy of the second diameter section. The diameter of the first diameter section may be at least two times greater than the diameter of the second diameter section. The length of the first diameter section may be less than or equal to half of the channel length of the semiconductor device.

In another embodiment, a method of fabricating a semiconductor device is provided. The method comprises forming a drain region on a semiconductor substrate and forming a nanowire structure between the source region and a drain region. The nanowire structure has a first diameter section joined with a second diameter section. The first diameter section is coupled to the drain region and has a diameter greater than the diameter of the second diameter section. The second diameter section is coupled to the source region. The method further comprises forming a gate region around the junction at which the first diameter section and the second diameter section are joined.

These aspects and other embodiments may include one or more of the following features. The gate region may comprise High-K dielectric material and metal gate material, wherein the High-K dielectric material is formed around the junction at which the first diameter section and the second diameter section are joined such that the circumference of the high-K material surrounding the second diameter section does not extend out as far as the circumference of the high-K material surrounding the first diameter section. The High-K dielectric surrounding the second diameter section may not extend out as far as the circumference of the first diameter section. The nanowire structure may further comprise a third diameter section having a diameter smaller than the diameter of the second diameter section and coupled between the second diameter section and the source region. The band gap energy of the first diameter section may be less than the band gap energy of the second diameter section. The diameter of the first diameter section may be at least two times greater than the diameter of the second diameter section. The length of the first diameter section may be less than or equal to half of the channel length of the semiconductor device.

In an additional embodiment, a nanowire structure for use as a channel in a semiconductor device is provided. The nanowire structure comprises a first diameter section joined with a second diameter section. The first diameter section is coupled to a drain region in the semiconductor device and has a diameter greater than the diameter of the second diameter section. The second diameter section is coupled to a source region in the semiconductor device. A gate region in the semiconductor device is formed around the junction at which the first diameter section and the second diameter section are joined.

These aspects and other embodiments may include one or more of the following features. The gate region may comprise High-K dielectric material and metal gate material, wherein the High-K dielectric material is formed around the junction at which the first diameter section and the second diameter section are joined such that the circumference of the high-K material surrounding the second diameter section does not extend out as far as the circumference of the high-K material surrounding the first diameter section. The High-K dielectric surrounding the second diameter section may not extend out as far as the circumference of the first diameter section. The nanowire structure may further comprise a third diameter section having a diameter smaller than the diameter of the second diameter section and coupled between the second diameter section and the source region. The band gap energy of the first diameter section may be less than the band gap energy of the second diameter section. The diameter of the first diameter section may be at least two times greater than the diameter of the second diameter section. The length of the first diameter section may be less than or equal to half of the channel length of the semiconductor device.

In another embodiment, a semiconductor device comprises a drain region formed on a semiconductor substrate. The semiconductor device further comprises a nanowire structure formed between a source region and the drain region. The nanowire structure has a tapered diameter section with a wider diameter section adjacent to one end and a narrower diameter section adjacent to another end. The wider diameter section is coupled to the drain region and the narrower diameter section is coupled to the source region. The semiconductor device further comprises a gate region formed around a central portion of the tapered diameter section.

In yet another embodiment, a method of fabricating a semiconductor device is provided. The method comprises forming a drain region on a semiconductor substrate and forming a nanowire structure between a source region and the drain region. The nanowire structure has a tapered diameter section with a wider diameter section adjacent to one end and a narrower diameter section adjacent to another end. The wider diameter section is coupled to the drain region and the narrower diameter section is coupled to the source region. The method further comprises forming a gate region around a central portion of the tapered diameter section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   source and drain regions, wherein one of the source region or the drain region is embedded within the semiconductor substrate and the other is formed on the semiconductor substrate;
   a nanowire structure formed between the source and drain regions and having a first diameter section and a second diameter section, the first diameter section being coupled to the drain region and having a surface, a diameter of which is at least two times greater than the diameter of a junction at which the surface of the first diameter section and the second diameter section are joined, the second diameter section coupled to the source region, the nanowire structure oriented in a vertical direction extending upwardly from the source region and perpendicular to the semiconductor substrate; and
   a gate region formed around a perimeter of the junction surrounding less than the entirety of the nanowire structure in a vertical direction, wherein the gate region comprises high-k dielectric material completely surrounding the nanowire structure at the junction,
   wherein, in a cross-sectional view, a top surface of one of the source region or the drain region contacts an entirety of the first diameter section.

2. The semiconductor device of claim 1, wherein the gate region further comprises metal gate material and wherein the circumference of the high-k dielectric material surrounding the second diameter section does not extend out as far as the circumference of the high-k dielectric material surrounding the first diameter section.

3. The semiconductor device of claim 2, wherein the high-k dielectric material surrounding the second diameter section does not extend out as far as the circumference of the first diameter section.

4. The semiconductor device of claim 1, wherein the nanowire structure further comprises a third diameter section having a diameter smaller than the diameter of the second diameter section and coupled between the second diameter section and the source region.

5. The semiconductor device of claim 1, wherein the band gap energy of the first diameter section is less than the band gap energy of the second diameter section.

6. The semiconductor device of claim 1, wherein the length of the first diameter section is less than or equal to half of the channel length of the semiconductor device.

7. The semiconductor device of claim 1, further comprising:
a gate oxide layer extending along the nanowire structure between the source and drain regions and surrounding a perimeter of the nanowire structure, wherein the gate oxide layer is beneath the gate region; and
an insulation material surrounding the nanowire structure and the gate region.

8. A method of fabricating a semiconductor device comprising:
forming source and drain regions, wherein one of the source region or the drain region is embedded within a semiconductor substrate and the other is on the semiconductor substrate;
forming a nanowire structure between the source and drain regions having a first diameter section and a second diameter section, the first diameter section coupled to the drain region and having a surface, a diameter of which is at least two times greater than the diameter of a junction at which the surface of the first diameter section and the second diameter section are joined, the second diameter section coupled to the source region, the nanowire structure oriented in a vertical direction extending upwardly from the source region and perpendicular to the semiconductor substrate; and
forming a gate region around a perimeter of the junction surrounding less than the entirety of the nanowire structure in a vertical direction, wherein the gate region comprises high-k dielectric material completely surrounding the nanowire structure at the junction,
wherein, in a cross-sectional view, a top surface of one of the source regions or the drain regions contacts an entirety of the first diameter section.

9. The method of claim 8, wherein the nanowire structure further comprises a third diameter section having a diameter smaller than the diameter of the second diameter section and coupled between the second diameter section and the source region.

10. The method of claim 8, wherein the gate region further comprises metal gate material and wherein the circumference of the high-k dielectric material surrounding the second diameter section does not extend out as far as the circumference of the high-k material surrounding the first diameter section.

11. The method of claim 10, wherein the high-k dielectric material surrounding the second diameter section does not extend out as far as the circumference of the first diameter section.

12. The method of claim 8, wherein the band gap energy of the first diameter section is less than the band gap energy of the second diameter section.

13. The method of claim 8, wherein the length of the first diameter section is less than or equal to half of the channel length of the semiconductor device.

14. The method of claim 8, further comprising:
forming a gate oxide layer extending along the nanowire structure between the source and drain regions and surrounding a perimeter of the nanowire structure, wherein the gate oxide layer is beneath the gate region; and
forming an insulation material surrounding the nanowire structure and the gate region.

15. A nanowire structure for use as a channel in a semiconductor device, the nanowire structure comprising:
a first diameter section; and
a second diameter section, the first diameter section being coupled to a drain region in the semiconductor device and having a surface, a diameter of which is at least two times greater than a diameter of a junction at which the surface of the first diameter section and the second diameter section are joined, the second diameter section coupled to a source region in the semiconductor device, wherein a gate region in the semiconductor device is formed around a perimeter of the junction surrounding less than the entirety of the nanowire structure in a vertical direction and wherein the first diameter section is oriented in a vertical direction extending upwardly from the source region, wherein the gate region comprises high-k dielectric material completely surrounding the nanowire structure at the junction and wherein one of the source region or the drain region is embedded within a substrate of the semiconductor device and the other is formed on the substrate,
wherein, in a cross-sectional view, a top surface of one of the source region or the drain region contacts an entirety of the first diameter section.

16. The nanowire structure of claim 15, wherein the nanowire structure further comprises a third diameter section having a diameter smaller than the diameter of the second diameter section.

17. The nanowire structure of claim 15, wherein the gate region further comprises metal gate material and wherein the high-k dielectric material is formed around the junction at which the first diameter section and the second diameter section are joined such that the circumference of the high-k dielectric material surrounding the second diameter section does not extend out as far as the circumference of the high-k dielectric material surrounding the first diameter section.

18. The nanowire structure of claim 15, wherein the band gap energy of the first diameter section is less than the band gap energy of the second diameter section.

19. The nanowire structure of claim 15, wherein the length of the first diameter section is less than or equal to half of the channel length of the semiconductor device.

20. A semiconductor device comprising:
a semiconductor substrate;
source and drain regions, wherein one of the source region or drain region is embedded within the semiconductor substrate and the other is formed on the semiconductor substrate;
a nanowire structure formed between the source and drain regions and having a first diameter section and a second diameter section, the first diameter section having a surface, a diameter of which is greater than a diameter of a junction at which the surface of the first diameter section and the second diameter section are joined, and a length substantially equal to half of the channel length of the semiconductor device, the nanowire structure oriented in a vertical direction extending upwardly from the source region and perpendicular to the semiconductor substrate; and
a gate region formed around a perimeter of the junction surrounding less than the entirety of the nanowire structure in a vertical direction, wherein the gate region comprises high-k dielectric material completely surrounding the nanowire structure at the junction, wherein, in a cross-sectional view, a top surface of one of the source regions or the drain regions contacts an entirety of the first diameter section.

21. The semiconductor device of claim 20, further comprising:
    a gate oxide layer extending along the nanowire structure between the source and drain regions and surrounding a perimeter of the nanowire structure, wherein the gate oxide layer is beneath the gate region; and
    an insulation material surrounding the nanowire structure and the gate region.

22. A method of fabricating a semiconductor device comprising:
    forming source and drain regions, wherein one of the source region or drain region is embedded within the semiconductor substrate and the other is on a semiconductor substrate;
    forming a nanowire structure between the source and drain regions and having a first diameter section and a second diameter section, the first diameter section having a surface, a diameter of which is greater than a diameter of a junction at which the surface of the first diameter section and the second diameter section are joined, and a length substantially equal to half the channel length of the semiconductor device, the nanowire structure oriented in a vertical direction extending upwardly from the source region and perpendicular to the semiconductor substrate; and
    forming a gate region around a perimeter of the junction surrounding less than the entirety of the nanowire structure in a vertical direction, wherein the gate region comprises high-k dielectric material completely surrounding the nanowire structure at the junction,
    wherein, in a cross-sectional view, a top surface of one of the source regions or the drain regions contacts an entirety of the first diameter section.

* * * * *